US012418158B2

(12) United States Patent
Koerner et al.

(10) Patent No.: US 12,418,158 B2
(45) Date of Patent: Sep. 16, 2025

(54) METHOD OF FORMING AN OPTICAL APERTURE OF A VERTICAL CAVITY SURFACE EMITTING LASER AND VERTICAL CAVITY SURFACE EMITTING LASER

(71) Applicant: TRUMPF Photonic Components GmbH, Ulm (DE)

(72) Inventors: Roman Koerner, Lonsee (DE); Jenny Tempeler, Ulm (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 580 days.

(21) Appl. No.: 17/939,992

(22) Filed: Sep. 8, 2022

(65) Prior Publication Data

US 2023/0006423 A1  Jan. 5, 2023

Related U.S. Application Data

(63) Continuation of application No. PCT/EP2021/056369, filed on Mar. 12, 2021.

(30) Foreign Application Priority Data

Mar. 20, 2020 (EP) .................... 20164460

(51) Int. Cl.
*H01S 5/183* (2006.01)

(52) U.S. Cl.
CPC ...... *H01S 5/18311* (2013.01); *H01S 5/18313* (2013.01); *H01S 5/18308* (2013.01)

(58) Field of Classification Search
CPC ............. H01S 5/18311; H01S 5/18308; H01S 5/18377; H01S 5/18313
See application file for complete search history.

(56) References Cited

U.S. PATENT DOCUMENTS

| 5,359,518 | A | 10/1994 | Wimmer |
| 5,359,618 | A | 10/1994 | Lebby et al. |
| 8,265,115 | B2 | 9/2012 | Ikuta |

(Continued)

FOREIGN PATENT DOCUMENTS

| CN | 1702928 A | 11/2005 |
| CN | 101986488 A | 3/2011 |

(Continued)

*Primary Examiner* — James A Menefee
(74) *Attorney, Agent, or Firm* — LEYDIG, VOIT & MAYER, LTD.

(57) ABSTRACT

A method of forming an optical aperture of a vertical cavity surface emitting laser includes the steps of providing a layer stack of semiconductor layers, the semiconductor layers including an intermediate layer comprising a semiconductor material suitable to be oxidized and oxidizing the intermediate layer to an oxidation width so as to form an oxidized outer region and a non-oxidized central region in the intermediate layer. The method also includes removing at least a part of the oxidized outer region so as to form a gap where the oxidized outer region or the part of the oxidized outer region has been removed, depositing an electrically non-conducting material on walls of the gap with a thickness smaller than a thickness of the gap, and filling a remaining void of the gap with a further material.

15 Claims, 9 Drawing Sheets

(56) References Cited

U.S. PATENT DOCUMENTS

| | | | |
|---|---|---|---|
| 2004/0058467 A1* | 3/2004 | Chirovsky | H01S 5/18341 438/47 |
| 2004/0180460 A1 | 9/2004 | Chirovsky et al. | |
| 2005/0118741 A1 | 6/2005 | Song et al. | |
| 2005/0121678 A1 | 6/2005 | Ezaki et al. | |
| 2005/0201436 A1 | 9/2005 | Collins | |
| 2006/0013276 A1 | 1/2006 | McHugo | |
| 2008/0137692 A1 | 6/2008 | Park et al. | |
| 2009/0262765 A1* | 10/2009 | Chang | H01S 5/18333 716/132 |
| 2011/0076854 A1* | 3/2011 | Takeo | H01S 5/18313 438/745 |
| 2011/0211869 A1* | 9/2011 | Shouji | H01S 5/423 399/177 |
| 2012/0094408 A1* | 4/2012 | Onishi | H01S 5/18311 438/29 |
| 2012/0163407 A1* | 6/2012 | Yang | H01S 5/18347 372/50.11 |
| 2019/0181615 A1 | 6/2019 | Choi | |
| 2019/0319429 A1 | 10/2019 | Ledentsov et al. | |
| 2019/0363515 A1 | 11/2019 | Kuramoto et al. | |

FOREIGN PATENT DOCUMENTS

| | | |
|---|---|---|
| JP | 2000294872 A | 10/2000 |
| JP | 2004158664 A | 6/2004 |
| JP | 2009188238 A | 8/2009 |
| JP | 2009238832 A | 10/2009 |
| WO | WO 2010058805 A1 | 5/2010 |

* cited by examiner

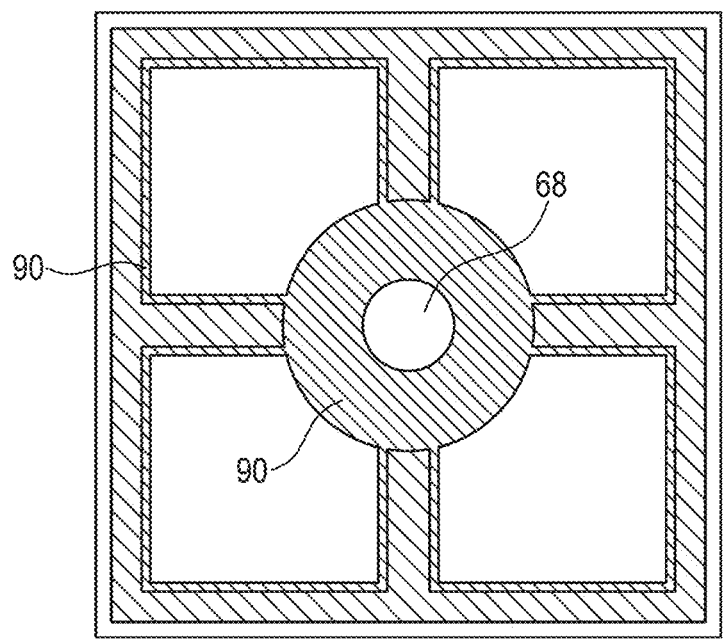
Fig. 11
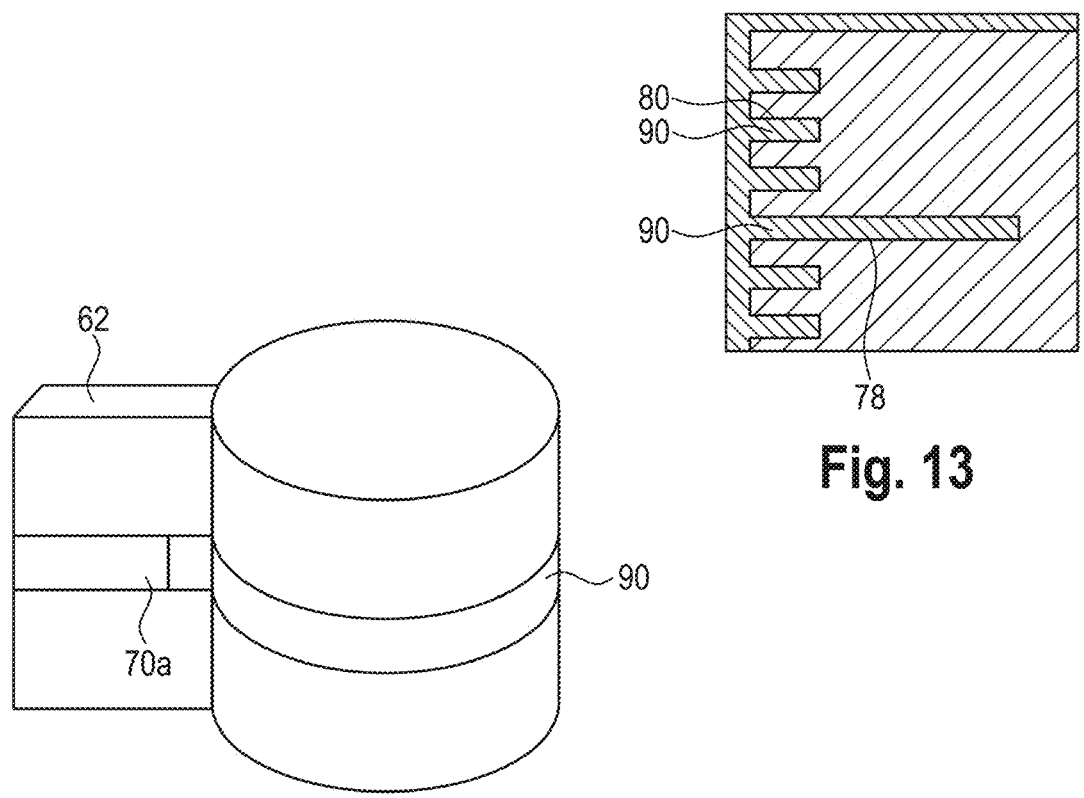
Fig. 13
Fig. 12

METHOD OF FORMING AN OPTICAL APERTURE OF A VERTICAL CAVITY SURFACE EMITTING LASER AND VERTICAL CAVITY SURFACE EMITTING LASER

CROSS REFERENCE TO RELATED APPLICATIONS

This application is a continuation of International Application No. PCT/EP2021/056369 (WO 2021/185697 A1), filed on Mar. 12, 2021, and claims benefit to European Patent Application No. EP 20164460.6, filed on Mar. 20, 2020. The aforementioned applications are hereby incorporated by reference herein.

FIELD

The present invention relates to a method of forming an optical aperture of a vertical cavity surface emitting laser. The invention further relates to a vertical cavity surface emitting laser having an optical aperture.

BACKGROUND

Vertical cavity surface emitting lasers (VCSELs) are a type of semiconductor laser diodes with laser beam emission perpendicular to the top or bottom surface of the device. Typically, a VCSEL comprises two DBRs (DBR=distributed Bragg reflector) parallel to the wafer surface, and an active region comprising one or more quantum wells for the laser light generation arranged between the two DBRs. The DBRs comprise layers with alternating high and low refractive indices. In common VCSELs, the DBRs are doped as p-type and n-type materials, forming a diode junction. In order to enable low threshold currents, a VCSEL typically has one or more optical apertures configured to restrict the current in the VCSEL to a confined region. One technique to form the optical aperture uses oxidizing the semiconductor material in one or more layers of the VCSEL layer stack to a desired oxidation depth. The layer(s) to be oxidized typically is/are high-content aluminum layer(s) of the layer stack. The current path between the DBRs is restricted to the central non-oxidized region of the oxidized layer(s), as the oxidized outer region is non-conductive. Laser light formation is substantially restricted to the central region of the oxidized layer(s). The central region thus forms the optical aperture.

During the VCSEL fabrication process, mechanical stress related damage of the VCSEL is a serious issue, as it decreases operational reliability and life-time of the VCSEL. The highest amount of mechanical stress (up to 100 MPa) is generated closely to the most sensitive area of the device, namely the optical active quantum well region. If the optical aperture is formed by oxidation of e.g. a specific AlGaAs layer, transformation of the crystallographic structure into $Al_2O_3$ creates strong lattice mismatch and therefore mechanical stress between the $Al_2O_3$ and the surrounding AlGaAs layers.

WO 2010/058805 A1 discloses a method for manufacturing a surface-emitting laser device. The method includes forming a laminated body in which a lower reflecting mirror, a resonator structure including an active layer, and an upper reflecting layer having a selective oxidized layer are laminated on a substrate. The laminated body is etched to form a mesa structure having the selective oxidized layer exposed at side surfaces thereof. The selective oxidized layer is selectively oxidized from the side surfaces of the mesa structure to form a constriction structure in which a current passing region is surrounded by an oxide. A separating groove is formed at a position away from the mesa structure. An outermost front surface of at least a part of the laminated body exposed is passivated when the separating groove is formed. The passivated part is coated with a dielectric body.

JP 2004 158664 A discloses a semiconductor laser device provided with a current confinement structure. A further surface-emitting laser comprising an oxidized layer for current confinement is known from JP 2009 238832 A.

U.S. Pat. No. 5,359,618 A discloses a vertical cavity surface emitting laser with first and second mirror stacks and an active area sandwiched therebetween. The second mirror stack is formed into a mesa with exposed end surface and outer side walls and a centrally located light emission region. The portion of the mesa adjacent the exposed outer sidewalls has a reduced electrical conductance so as to spread operating current from the outer side walls into the centrally located light emission region. The electrical conductance of the portion is reduced by oxidizing or etching the outer sidewalls.

US 2006/013276 A1 discloses a vertical cavity surface emitting laser including a gap in a mirror stack and a protective layer sealing an end of the gap. The gap defines a boundary of the aperture of the VCSEL without introducing the stresses that oxide regions and oxide VCSELs can cause, and a protective layer, which can be a thin dielectric layer, shields the mirror stack from environmental damage. The VCSEL can thus achieve high reliability. A fabrication process for the VCSEL forms an oxidation hole, oxidizes a portion of an aluminum-rich layer in a mirror stack of the VCSEL exposed in the hole, and then removes all or some of the resulting oxide to form the desired gap. The protective layer can then be deposited to seal an end of the gap.

Thus, there is a need in an improved method of forming an optical aperture of a VCSEL.

SUMMARY

In an embodiment, the present disclosure provides a method of forming an optical aperture of a vertical cavity surface emitting laser that includes providing a layer stack of semiconductor layers, the semiconductor layers including an intermediate layer comprising a semiconductor material suitable to be oxidized and oxidizing the intermediate layer to an oxidation width so as to form an oxidized outer region and a non-oxidized central region in the intermediate layer. The method also includes removing at least a part of the oxidized outer region so as to form a gap where the oxidized outer region or the part of the oxidized outer region has been removed, depositing an electrically non-conducting material on walls of the gap with a thickness smaller than a thickness of the gap, and filling a remaining void of the gap with a further material.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 11 shows a top view of the structure in FIG. 8 in a further stage of the method of forming an optical aperture;

FIG. 12 shows a perspective side view of a part of the structure in FIG. 11;

FIG. 13 shows a cross-sectional side view of a part of the structure in FIG. 11;

DETAILED DESCRIPTION

Figure 1:
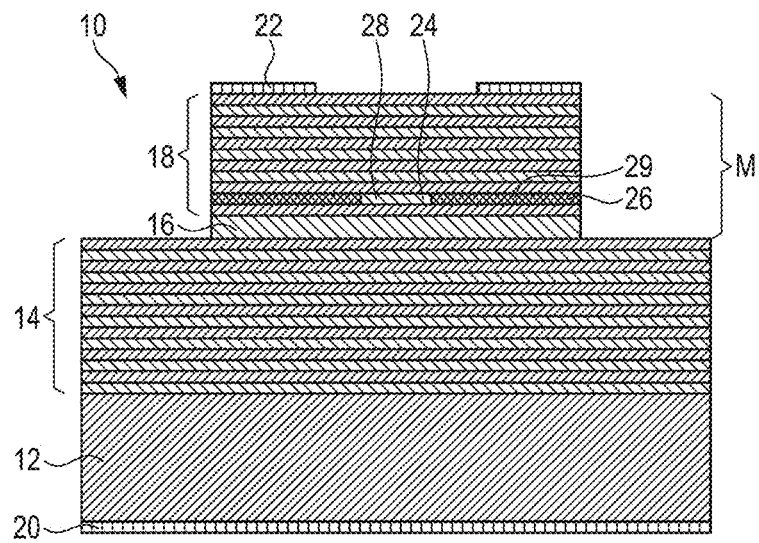
FIG. 1 shows a sketch of a VCSEL comprising an optical aperture.

It is an object of the invention to provide a method of forming an optical aperture in a vertical cavity surface emitting laser which reduces mechanical stress in the final VCSEL layer stack.

It is a further object of the invention to provide an improved VCSEL with increased life-time and/or operational reliability.

According to an aspect, a method of forming an optical aperture of a vertical cavity surface emitting laser (VCSEL) is provided, comprising:

providing a layer stack of semiconductor layers, the semiconductor layers including an intermediate layer, wherein the intermediate layer comprises a semiconductor material suitable to be oxidized, oxidizing the intermediate layer to an oxidation width so as to form an oxidized outer region and a non-oxidized central region in the intermediate layer, removing at least a part of the oxidized outer region so that a gap is formed where the oxidized region or the part of the oxidized outer region has been removed, and depositing an electrically non-conducting material in the gap.

Like in conventional processes, the method according to the invention uses an oxidation process to define the size of the optical aperture in the intermediate layer. The size of the optical aperture can be controlled by the oxidation width, which in turn may be controlled by the duration of the oxidation process and/or parameters of the oxidation atmosphere like pressure and temperature and constituents of the oxidation atmosphere. The oxidation rate further depends on the semiconductor material which is oxidized. Differently from the conventional methods of forming an optical aperture, the oxidized material is removed from at least a part of the oxidized outer region of the intermediate layer. It is also possible to remove the oxidized material completely from the oxidized outer region. By removing the oxidized material from at least a part of the oxidized outer region, a gap forms in the intermediate layer between layers of the layer stack which are adjacent to the intermediate layer. Mechanical stress implemented by the oxidization process due to strong lattice mismatch between the oxidized semiconductor material and the surrounding non-oxidized semiconductor material is thus relaxed. If the oxidized material is completely removed from the oxidized outer region of the intermediate layer, mechanical stress relaxation is achieved up to the tip of the oxidized outer region at the transition to the non-oxidized central region.

The gap formed after removing the oxidized material is at least partially filled with an electrically non-conducting material which is of much higher quality than the removed oxidized semiconductor material and does not lead to mechanical stress in the layer stack. The electrically non-conducting material is deposited in the gap on the gap walls. While the oxidation product obtained by oxidizing the semiconductor material of the intermediate layer, for example $Al_2O_3$ obtained from the oxidation of AlAs or AlGaAs has poor mechanical and electrical quality, the electrically non-conducting material deposited in the gap after removal of the oxidized semiconductor material may have a very good mechanical and electrical quality. In particular, the deposited electrically non-conducting material may passivate open or dangling bonds, which may be generated in the oxidation process, at the interfaces (gap walls) between the gap and the surrounding semiconductor layers without the implementation of stress. The electrically isolating behavior of the deposited material furthermore enables the current confinement.

Refinements of the method according to invention will be described hereinafter

In an embodiment, providing the layer stack may include:
epitaxially growing the layer stack,
etching the layer stack to form a pre-form of a mesa of the VCSEL and a support structure at least partially surrounding the pre-form of the mesa, the support structure comprising an outer supporting region and at least one supporting web connecting the outer supporting region with the pre-form of the mesa, wherein the pre-form of the mesa includes the intermediate layer.

This processing serves, on the one hand, the formation of an oxidation area for the later oxidation process. The oxidation area is formed by the outer wall of the pre-form of the mesa.

On the other hand, the mechanical support structure advantageously enables mechanical stability during and after the removal of the oxidized material from the intermediate layer, before the gap is re-filled. The size and thus strength of the mechanical support structure will depend on the desired final VCSEL mesa size and the oxidation width. For larger oxidation widths, stronger support structures with multiple connecting supporting webs are advantageous.

In this embodiment, it may be advantageous if the deposition of the electrically non-conductive material also covers the side wall of the pre-form of the mesa as it further stabilizes the pre-form of the mesa, and may fill further gaps which may be present after removal of oxidized material from further layers of the layer stack. In other words, the deposited electrically non-conductive material is somewhat "anchored" into these layers.

In an embodiment, etching the layer stack is performed such that the pre-form of the mesa has a tapering outer wall. The outer wall may taper from bottom to top (i.e. in direction of the epitaxial growth of the layer stack) of the pre-form of the mesa. The tapering shape of the pre-form of the mesa has the advantage that mechanical stability of the pre-form of the mesa is further increased. The side wall angle of the oxidation area (the outer wall of the pre-form of the mesa) with respect to the plane orientation of the layers of the layer stack may be chosen between 65° and 70°. In this angle range, a good mechanical stability is achieved, when the oxidized material is removed from the layer is achieved.

In an embodiment, the method may further comprise, after depositing the electrically non-conductive material in the gap, trim etching the pre-form of the mesa to obtain a final mesa having a straight (non-tapering) outer wall.

In combination with the embodiment described before, the mesa definition process may be splitted into two separate process steps, namely a first step of formation of the oxidation area by etching the layer stack to provide the mesa pre-form, and after oxidation, removal of the oxidized material and filling the non-conductive material in the gap, the pre-form of the mesa is further processed to obtain the final mesa which then may have an outer wall perpendicular to the plane orientation of the layers of the stack. The trim etch may also remove residual material which may have been deposited on the side wall of the pre-form of the mesa when re-filling the gap after removal of the oxidized material.

In a further embodiment, the intermediate layer may have a thickness which is significantly larger than thicknesses of semiconductor layers adjacent to or in vicinity of the intermediate layer.

The advantage here is that the thicker intermediate layer is oxidized more rapidly than the thinner surrounding semiconductor layers. A further advantage is that the oxidized material generated when oxidizing the intermediate layer has a higher porosity and is thus easier to remove. In a conventional VCSEL, a thicker oxidized layer would lead to an optical aperture with less current confinement ability due to a lower electrical breakdown field and reduced refractive index in the oxidized region of the layer. Since the oxidized material is removed in the method according to the present invention, such a disadvantage will not occur in the method according to the present invention, as the oxidized material is replaced by a high quality electrically non-conducting material after removal of the oxidized material.

The thickness of the intermediate layer, which may be defined in the epitaxial process, may be in a range from about 80 nm to about 100 nm, while the surrounding semiconductor layers may have a thickness in a range from about 20 nm to about 30 nm.

In an embodiment, the semiconductor material of the intermediate layer may be an Al-based semiconductor material, in particular AlAs or AlGaAs.

In a further embodiment, removing the oxidized intermediate layer may be performed by etching using a hydrofluoric acid dip or a fluorine gas phase based etching process.

A fluorine gas phase based etching process, also referred to as atomic layer etching, with exact control of the pressure is preferred. A high etching rate may be achieved in this way. A plasma or the like is less preferred as a plasma may damage susceptible layers. A further advantage of the fluorine gas phase etching process is the high selectivity for the oxidized material versus the semiconductor material.

In a further embodiment, depositing the electrically non-conducting material comprises depositing the electrically non-conducting material using atomic layer deposition.

Atomic layer deposition (ALD) is a deposition technology which is suitable to fill thin gaps with an aspect ratio of up to 1000:1 in a reliable manner.

The electrically non-conducting material is deposited on the gap walls with a thickness which is smaller than the thickness of the gap, wherein the electrically non-conducting material may be deposited on the gap walls with a thickness in a range from about 2 nm to about 5 nm. The electrically non-conducting material will not fully fill the gap in the intermediate layer, if the gap has a thickness of more than twice the deposited film thickness. As provided, a further material, in particular a high refractive index material, is then filled in the remaining void of the gap, after the deposition of the electrically non-conducting material.

Filling the remaining void of the gap with a high-refractive index material may be performed using fluid chemical wafer deposition. Suitable materials as the high-refractive index material are AlN, SiN and the like.

The electrically non-conducting material may be $Al_2O_3$ or oxidized TiN or $TiO_2$. Although $Al_2O_3$ may be the product in the intermediate layer after the oxidation process if the intermediate layer comprises for example AlAs, the $Al_2O_3$-layer when deposited in the gap after removal of the oxidized material from the intermediate layer may have a much higher mechanical and electrical quality due to the deposition process. In particular, the deposited $Al_2O_3$ may be much less porous than the $Al_2O_3$ resulting from the oxidation of the semiconductor material and may have a passivation effect at the interface to the surrounding layers.

In a further embodiment, oxidizing the intermediate layer may comprise wet-oxidation at a temperature in a range from about 320° C. to 350° C. and at a pressure of higher than 500 mbar. This measure may lead to a more diffusion limited oxidation process.

A method of fabricating a VCSEL may comprise the method of forming an optical aperture according to the present invention.

According to a further aspect, a vertical cavity surface emitting laser is provided, comprising:
  a layer stack of semiconductor layers, the semiconductor layers including at least one intermediate layer, the intermediate layer comprising a semiconductor material and forming an optical aperture of the vertical cavity surface emitting laser,
  wherein the at least one intermediate layer has a central region comprising the semiconductor material, and an outer region comprising a deposited layer of electrically non-conducting material deposited on walls of a gap formed by removal of oxidized material from at least a part of the outer region, wherein the deposited layer has a thickness which is smaller than the thickness of the intermediate layer, and the outer region additionally comprises a further material filling a remaining void of the gap not filled by the layer of electrically non-conductive material.

The deposited layer of electrically non-conducting material thus is a layer comprising a material other than a material obtained by oxidizing the semiconductor material and thus is different from an oxidized layer obtained by oxidizing the semiconductor material of the intermediate layer. In particular, the deposited layer has a higher mechanical and electrical quality than an oxidized layer.

The vertical cavity surface emitting laser has the same or similar advantages as described above with respect to the method according to the invention.

The intermediate layer forming the optical aperture may be a layer in a DBR of the VCSEL or a layer between the active region and a DBR. The VCSEL may have more than one optical aperture in the layer stack, which may have been formed by the method according to the invention.

Further features and advantages will become apparent from the following description of exemplary embodiments with reference to the drawings.

Before describing a method of forming an optical aperture in a vertical cavity surface emitting laser (VCSEL), a VCSEL with optical aperture will be described with reference to FIG. 1. VCSEL 10 comprises a layer stack of a plurality of semiconductor layers. The layer stack may comprise, on a substrate 12, a first distributed Bragg reflector (DBR) 14, an active region 16 for laser light emission, and a second DBR 18. The active region 16 is arranged between the first and second DBRs 14, 18. The first DBR 14, the active regions 16 and the second DBR 16 form an optical resonator. The first DBR 14 may comprise n-doped AlGaAs/GaAs layer pairs, for example. The active region 16 may comprise one or more quantum wells for laser emission. The second DBR 18 may comprise p-doped AlGaAs/GaAs layer pairs. The VCSEL 10 may further comprise an n-contact 20 and an annular p-contact 22. A region M of the VCSEL 10 is referred to as a mesa.

The VCSEL 10 further comprises an optical aperture 24. The optical aperture 24 is integrated in the second DBR 18 in this example. The optical aperture 24 is formed in an intermediate layer 26 of the layer stack of the VCSEL 10. In conventional VCSELs, the optical aperture 24 is formed by oxidizing the intermediate layer 26 which may comprise an Al-based semiconductor material with a high Al content. For example, the intermediate layer 26 may comprise AlAs which is oxidized so that an outer region 28 of the intermediate layer 26 comprises $Al_2O_3$ as an oxidation product of the AlAs intermediate layer 26.

A central region 28 of the intermediate layer 26 forms the optical aperture. An oxidized outer region 29 of the intermediate layer 26 serves to confine the current through the active region 16, i.e. the current is restricted to the central region 28 of the intermediate layer 26. The optical aperture 24 further confines the optical emission of the active region 16 to the central region 28 of the intermediate layer 26. It is to be understood that a VCSEL in other embodiments can comprise more than one intermediate layers each forming an optical aperture.

A disadvantage of the oxidized outer region 28 of the intermediate layer 26 is that the oxidation product of the semiconductor material of the intermediate layer 26, e.g. $Al_2O_3$, exhibits a strong lattice mismatch with the surrounding semiconductor layers, in the present example the AlGaAs layers. The lattice mismatch generates mechanical stress in the surrounding semiconductor layers, leading to reduced life-time and reduced operational reliability of the VCSEL. In the following, a method of forming an optical aperture in a VCSEL and such a VCSEL which mitigate these drawbacks will be described with reference to the further figures.

Figure 2:
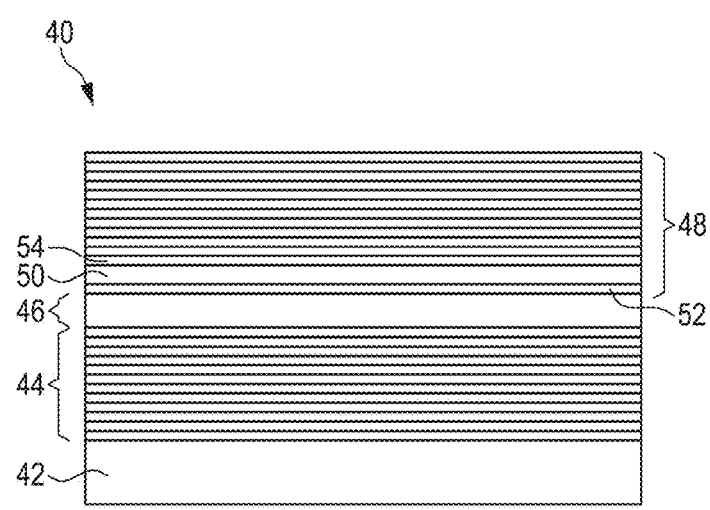
FIG. 2 shows a layer stack of semiconductor layers in a stage of a method of forming an optical aperture of a VCSEL.

According to FIG. 2, a layer stack 40 of semiconductor layers is provided. The layer stack 40 may comprise a substrate 42, and epitaxially grown thereon, a plurality of semiconductor layers forming a first DBR 44, one or more semiconductor layers forming an active region 46 and a plurality of further semiconductor layers forming a second DBR 48. The DBRs 44 and 48 and the active region 46 may be arranged as described above. The semiconductor layers of the layer stack 40 may comprise AlGaAs and GaAs layers.

The layer stack 40 further comprises an intermediate layer 50 in which an optical aperture is to be formed. The intermediate layer 50 may be arranged as shown in the second DBR 48. The intermediate layer 50 may be arranged in the first DBR 44 or between the active region 46 and one of the DBRs 44, 48 in other embodiments.

As shown in FIG. 2, the intermediate layer 50 has a thickness which is significantly larger than the thickness of the semiconductor layers, e.g. layers 52 and 54, in vicinity of the intermediate layer 50. The larger thickness of the intermediate layer 50 is advantageous in the method of forming the optical aperture as will be described below. For example, the intermediate layer 50 may have a thickness in a range from about 80 nm to about 100 nm. The layers 52 and 54 and the remaining layers of the second DBR 48, which may have a thickness in a range from about 10 nm to about 15 nm.

The intermediate layer 50 comprises a semiconductor material which is suitable to be oxidized. The semiconductor material of the intermediate layer 50 may be an Al-based semiconductor material, in particular AlAs or AlGaAs, in an embodiment.

Figure 3:
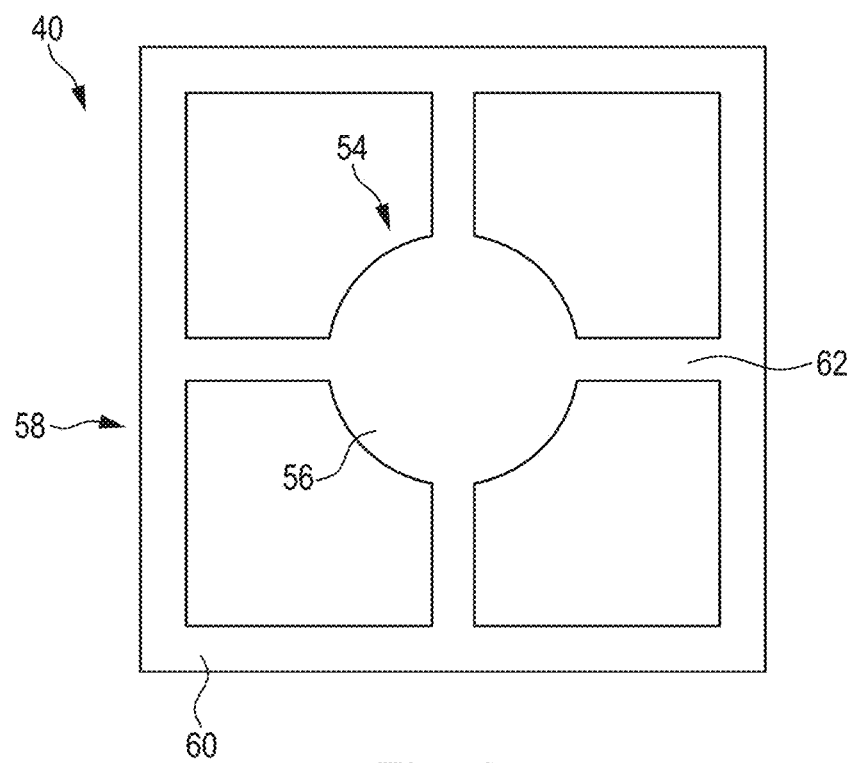
FIG. 3 shows a top view of the layer stack in FIG. 2 in a further stage of the method of forming an optical aperture.
Figure 4:
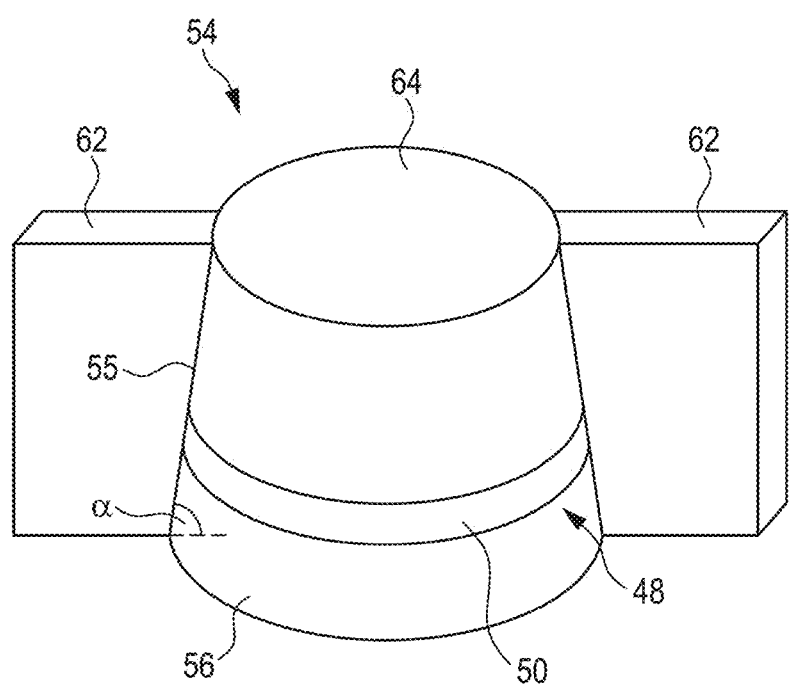
FIG. 4 shows a side view of a part of the structure in FIG. 3.

Next, with reference to FIGS. 3 and 4, the method proceeds with the formation of an oxidation area. This is performed by edging the layer stack 40 to form a pre-form 54 of a mesa 56 of the VCSEL. When etching the layer stack 40, not only the pre-form 54 of the mesa 56 is created, but also a support structure 58 which at least partially, here fully surrounds the mesa 56. The support structure 58 comprises an outer supporting region 60 and at least one supporting or connecting web 62, in the example shown four webs 62. The webs 62 connect the outer region 60 with the mesa 56. The support structure 58 provides sufficient support of the layer stack 40 in the region of the pre-form 54 of the mesa 56 in the subsequent processing steps of the method of forming an optical aperture in the layer stack 40.

The pre-form 54 of the mesa 56 forms the oxidation area for the later oxidation process and includes the intermediate layer 50 as illustrated in FIG. 4. FIG. 4 only shows the layer stack 40 in the region of the upper layers of the layer stack, here in the region of the second DBR 48. The first DBR 44 and the substrate 42 are not shown. The mesa 56 may also include the active region 46.

Etching the layer stack 40 is performed such that the pre-form 54 of the mesa 56 has an outer wall 55 tapering towards an end 64 of the mesa 56, which is the end facing away from the substrate 42. An angle α of the outer wall 55 of the pre-form 54 of the mesa 56 to a plane orientation of the layers of the stack 40 may be in a range from about 65° to about 75° for providing good mechanical stability.

Figure 5:
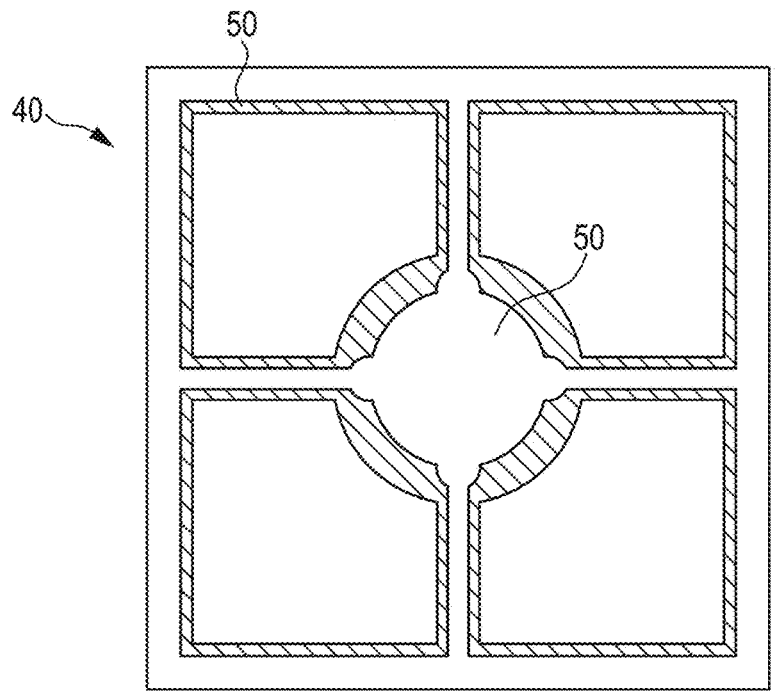
FIG. 5 shows a top view of the structure in FIG. 3 in a further stage of the method of forming an optical aperture.
Figure 6:
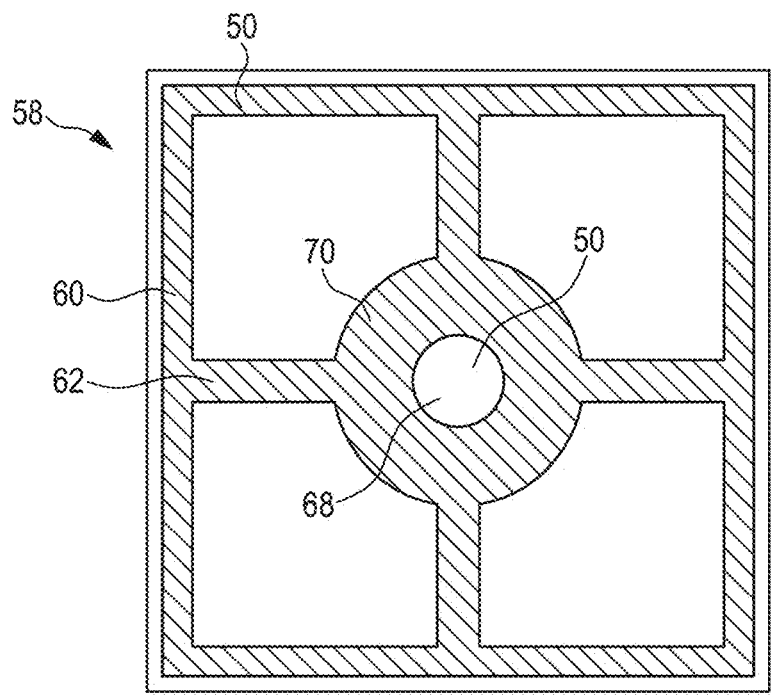
FIG. 6 shows a top view of the structure in FIG. 5 in a further stage of the method of forming an optical aperture.

After the oxidation area is formed as described above, the method of forming an optical aperture proceeds with oxidizing the intermediate layer 50 as shown in FIGS. 5 and 6. FIG. 5 shows the oxidation process at a beginning and FIG. 6 shows the oxidation process when terminated. The hatchet regions in FIGS. 5 and 6 indicate the oxidized material of the intermediate layer 50. Oxidizing the intermediate layer 50 is performed to an oxidation width which is smaller than half the total width of the pre-form 54 of the mesa 56 in the region of the intermediate layer 50. Oxidizing may be performed using wet-oxidation at a temperature in a range from about 320° C. to 350° C. and at a pressure of higher than 500 mbar.

If the intermediate layer 50 comprises AlAs or AlGaAs, the oxidized material comprises $Al_2O_3$. When the oxidation process is finished, the intermediate layer 50 has an oxidized outer region 70 and a non-oxidized central region 68 as illustrated in FIG. 6. The center region 68 of the intermediate layer 50 which is shown in FIG. 6 will be the optical aperture in the final VCSEL.

The oxidation process may also oxidize material in the support structure 58 including the webs 62 and the outer region 60 of the support structure 58 as indicated.

Oxidation of other layers of the layer stack 40 in the oxidation area formed by the pre-form 54 of the mesa 56 may also occur, in particular if they comprise Al in the semiconductor material. As described above, the thickness of the intermediate layer 50 is larger than the thickness of layers in the vicinity of the intermediate layer 50. A thicker layer, e.g. a thicker AlAs layer, is oxidized more rapidly than thinner layers, e.g. thinner AlAs-layers. This means that the oxidation width or depth of the intermediate layer 50 is larger than in the surrounding thinner layers. A further advantage of the higher thickness of the intermediate layer 50 is that the oxidized material, e.g. $Al_2O_3$ has a higher porosity and thus can be easier removed. In a conventional VCSEL fabrication process, a thick porous $Al_2O_3$ layer would lead to less current confinement and optical mode confinement ability due to a lower electrical breakdown field and reduced reflective index. In the method of forming an optical aperture according to the present disclosure, this will not pose a problem as the oxidized material is removed at least partially from the oxidized outer region 70 as will be described below.

The method proceeds with the removal of the oxidized material from the oxidized outer region 70 of the intermediate layer 50. Removal of the oxidized intermediate layer 50 may include removing the whole oxidized material from the outer region 70 of the intermediate layer 50 or only a part thereof. In other words, the oxidized material may be removed over the full width of the oxidized outer region 70 or only over a part of the width of the oxidized outer region 70.

Figure 7:
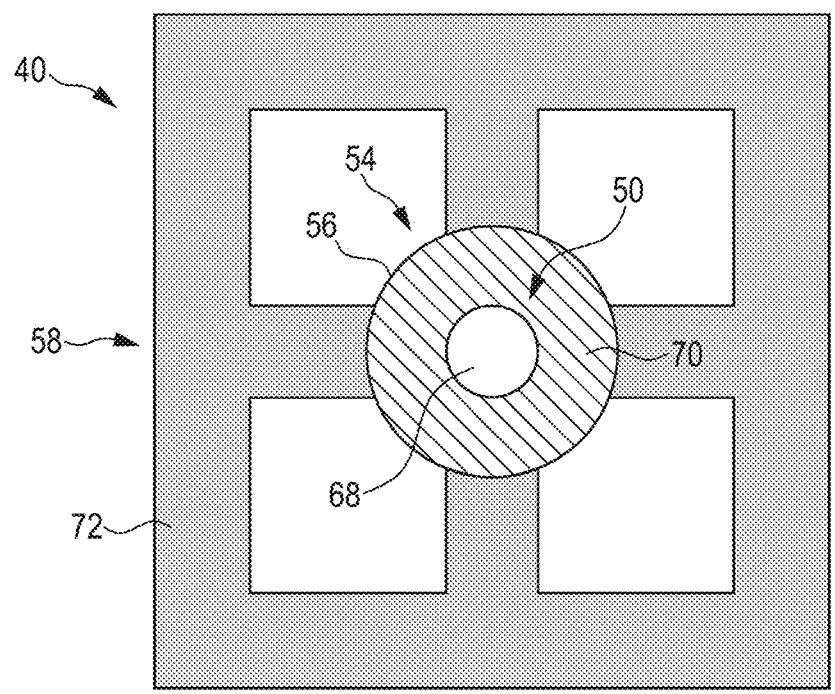
FIG. 7 shows a top view of the structure in FIG. 6 in a further stage of the method of forming an optical aperture.
Figure 10:
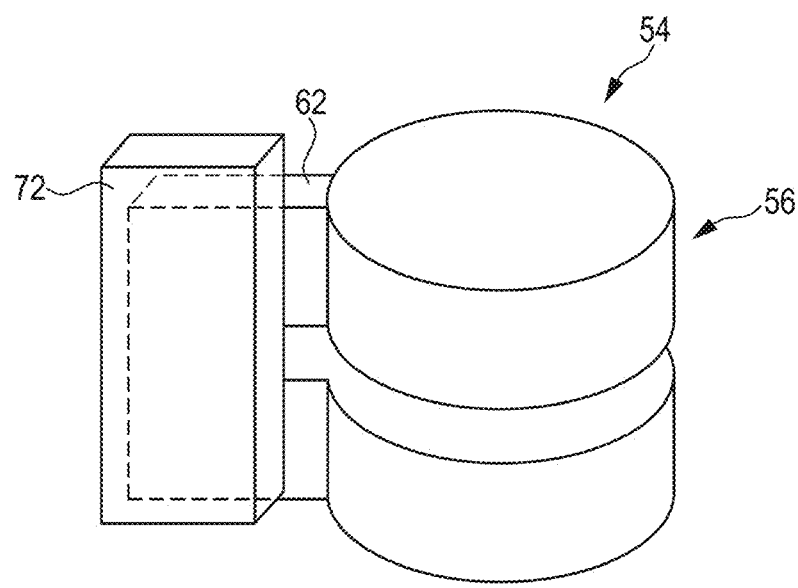
FIG. 10 shows a perspective side view of a part of the structure in the stage of the method of forming an optical aperture according to FIG. 8.

FIG. 7 shows a processing step of the method prior to the removal of the oxidized material. In this processing step, the layer stack 40 is covered with a lithography protection film 72 illustrated in FIG. 7 in grey. The protection film 72 covers the protection structure 58. The protection structure does not cover the outer wall of the pre-form 54 of the mesa 56 as illustrated in FIG. 10. FIG. 10 illustrates in more detail that the protection film 72 does not cover the connecting webs 62 in vicinity of the pre-form 54 of the mesa 56. The tapering shape of the pre-form 54 of the mesa 56 is not shown in FIG. 10.

Figure 8:
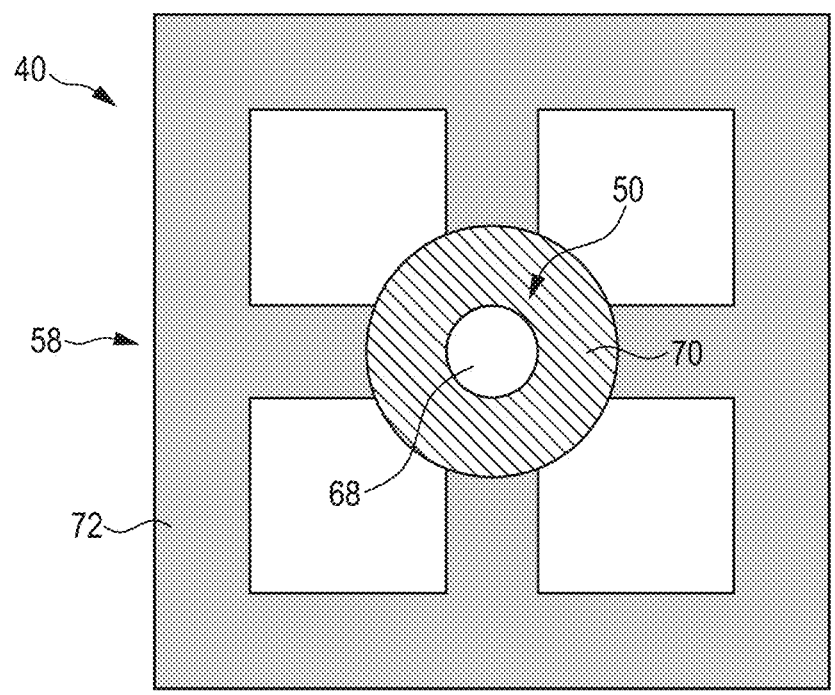
FIG. 8 shows a top view of the structure in FIG. 7 in a further stage of the method of forming an optical aperture.

Next, the oxidized material is removed from the total oxidized region 70 or a part of the oxidized outer region 70 of the intermediate layer 50. This is indicated in FIG. 8 with a hatching which is different from the hatching of the outer region 70 in FIG. 7.

Removal of the oxidized material from at least part of the width of the oxidized outer region 70 of the intermediate layer 50 may be performed by etching using a hydrofluoric acid dip or a fluorine gas phase based etching process. The etching process should have a high selectivity so that only oxidized material is removed and semiconductor material id not removed from surrounding layers and the central region 68 of the intermediate layer 50. The etching process preferably is an atomic layer etching in a closed system under specific pressure control.

Figure 9:
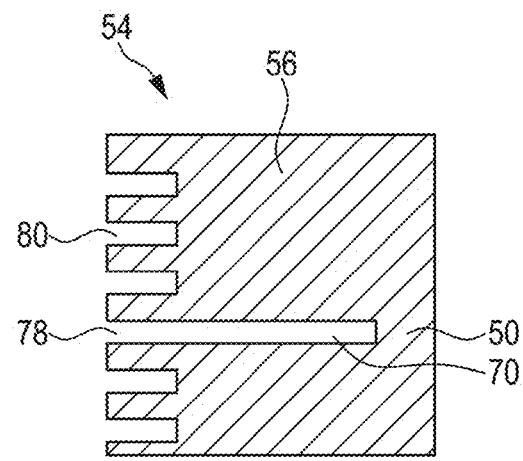
FIG. 9 shows a cross-sectional side view of a part of the structure in the stage of the method according to FIG. 8.

The removal of oxidized material from the oxidized outer region 70 of the intermediate layer 50 and from other areas of the pre-form 54 of the mesa 56, where oxides have formed due to the oxidation process, leads to the formation of gaps 78 and 80, as shown in FIG. 9. Gap 78 is formed after removal of the oxidized material from the oxidized outer region 70 of the intermediate layer 50. Gaps 80 are formed in other layers where oxidized material has formed during the oxidation process and which are also removed by the atomic layer etching. FIG. 9 also illustrates that the oxidation process leads to a higher oxidation width in the thicker intermediate layer 50 than in the thinner surrounding Al containing layers of the layer stack 40.

The support structure 58 advantageously mechanically stabilizes the pre-form 54 of the mesa 56 when the oxidized material is removed in the etching process.

The method proceeds with filling the gaps 78, 80 formed by the removal of the oxidized material with a high quality material as will be described with reference to FIGS. 11-13.

Refilling the gaps 78, 80 with high-quality material is performed by depositing a layer of an electrically non-conducting material 90 in the gaps 78, 80, preferably by atomic layer deposition. The electrically non-conducting material may be $Al_2O_3$, oxidized TiN or $TiO_2$. $Al_2O_3$ deposited by atomic layer deposition has much higher quality in terms of crystallographic structure, e.g. is less porous and less brittle, than $Al_2O_3$ as an oxidation product of e.g. AlAs. The layer of electrically non-conducting material 90 also passivates open bonds at the released interfaces (gap walls) without the implementation of stress. The electrically isolating behavior of the electrically non-conducting material further enables the current confinement in the intermediate layer 50 to the central region 68.

The electrically non-conducting material 90 is preferably deposited on the gap wall of the gap 78 in the intermediate layer 50 with a thickness which is smaller than the thickness of the gap 78. For example, the electrically non-conducting material 90 may be deposited on the gap walls of the gap 78 with a thickness in a range from about 2 nm to about 5 nm.

In case the intermediate layer 50 has a relative large thickness, the layer of electrically non-conducting material 90 will not fully fill the gap 78 over its full thickness. Therefore, any remaining void in the gap 78 may be additionally filled with a high-refractive index material. This may be performed by fluid chemical vapor deposition. A high-refractive index material may be amorphous silicon (a-Si) filled at a temperature of about 150° C. The high-index material improves optical mode confinement to the central region 68 of the intermediate layer 50 and, in addition provides further mechanical stabilization of the mesa 56.

FIG. 13 shows the gap 78 which is now filled with the electrically non-conducting material 90 or, preferably, with a combination of electrically non-conducting material 90 and high-refractive index material. The gaps 80 may also be filled with these materials.

FIG. 12 shows that in the connecting webs 62, oxidized material 70 is still present as these areas were covered with the protective film 72 (FIG. 10).

After the gaps 78, 80 are refilled as described before, the pre-form 54 is stable enough so that the process may proceed with a trim edge of the pre-form 54 which serves to remove any residual material of the refill process sequences, to remove the webs 62 and the outer region 60 of the support structure at least partially (e.g in areas thereof where oxidized material from the oxidation process is still present or where this structure is not needed in the final VCSEL), and to create a straight outer wall of the mesa 56 ($\alpha=90°$).

Figure 14:
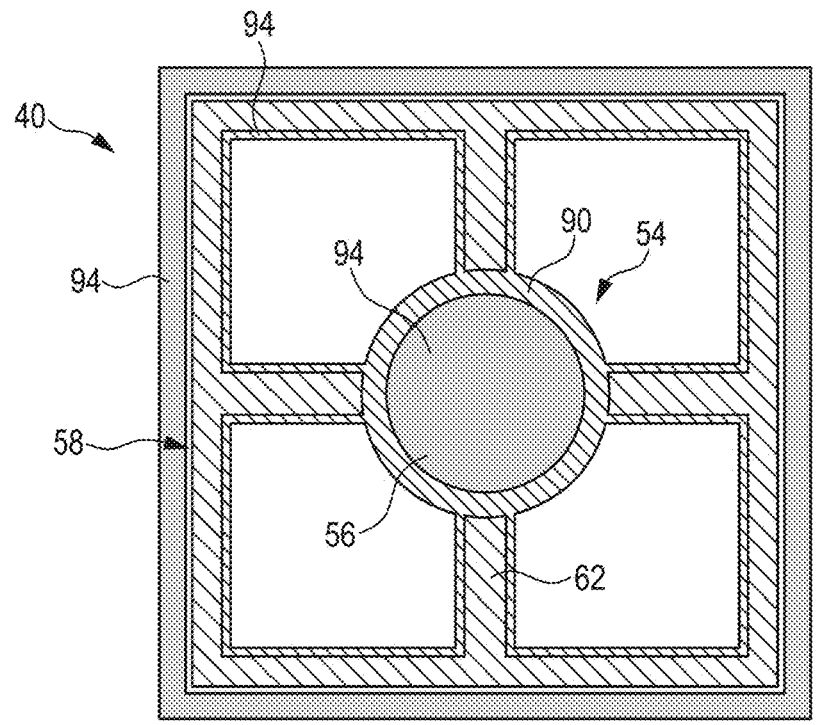
FIG. 14 shows the structure in FIG. 11 in a further stage of the method of forming an optical aperture.

FIG. 14 shows a processing step of the method in preparation of the trim edge of the layer stack 40. Those regions of the layer stack 40 which are not to be trim etched are protected with a lithographic protection layer 94. Regions, where residual material of the electrically non-conducting material 90 and/or part of the high-refractive index material is present, are not covered by the protective film 94 as shown in FIG. 14.

Figure 15:
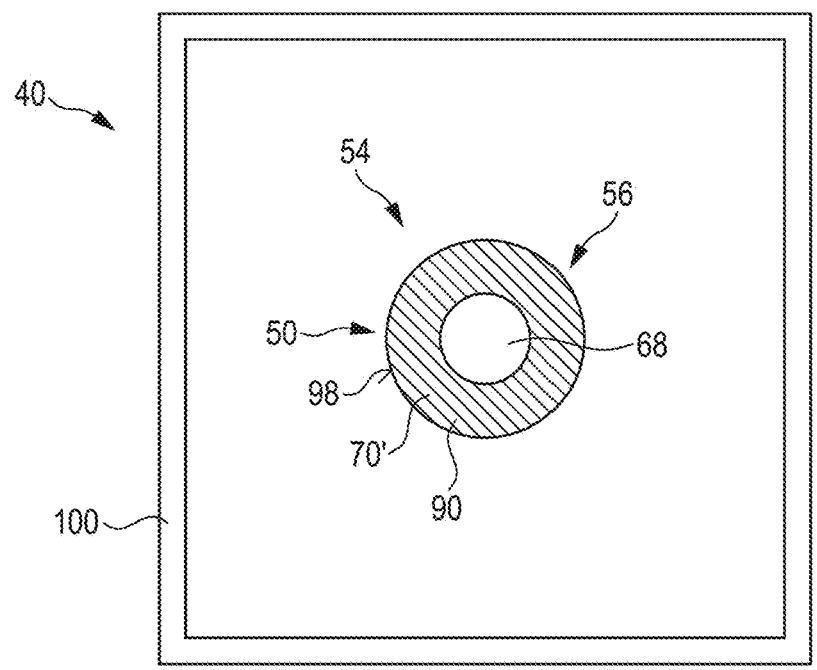
FIG. 15 shows a top view of the structure in FIG. 14 in further stage of the method of forming an optical aperture.
Figure 18:
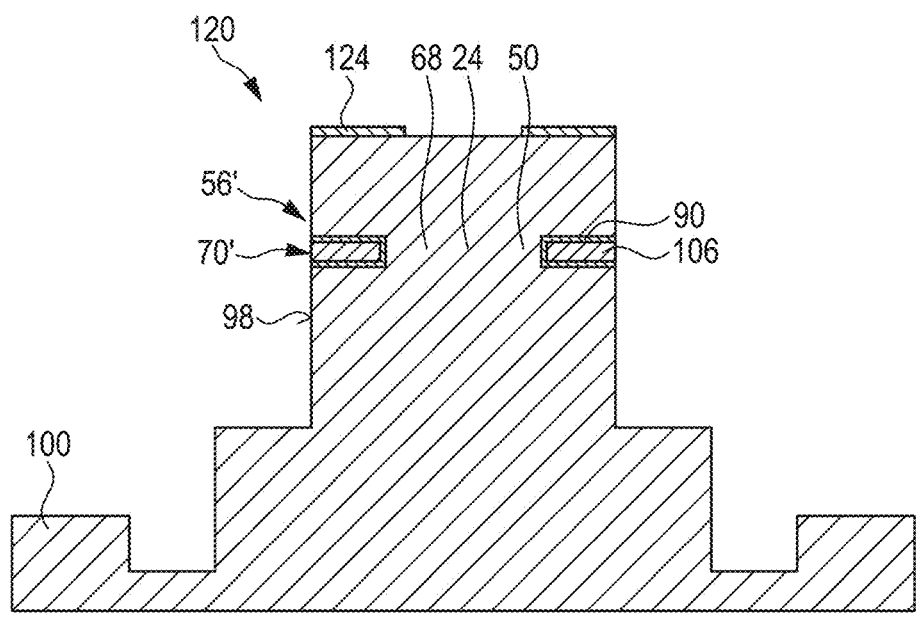
FIG. 18 shows a sketch of a VCSEL with an optical aperture.

Next, as shown in FIG. 15, trim etching is performed to obtain the final mesa 56 which has a straight outer wall 98 as shown in FIG. 18. The trim etching process also removes the support structure 58. A region 100 in FIG. 15 is part of the lower regions of the layer stack 40. FIG. 15 shows the intermediate layer 50 with the central region 68 and an outer region 70' which now comprises the electrically non-conducting material 90 or a combination of electrically non-conducting material 90 and high-refractive index material.

Figure 16:
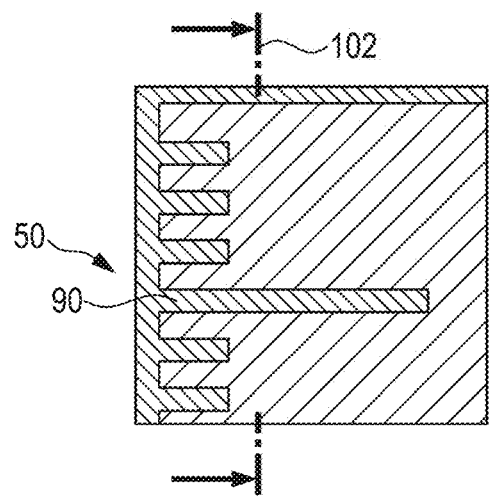
FIG. 16 shows a cross-sectional side view of the structure in FIG. 14.
Figure 17:
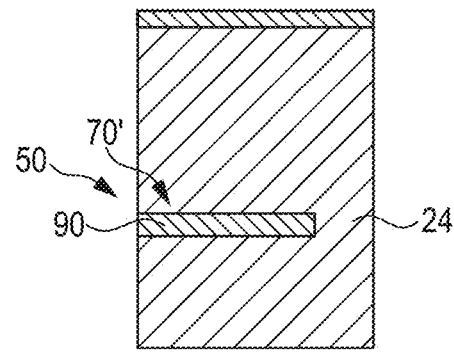
FIG. 17 shows a cross-sectional side view of the structure in FIG. 15.

FIG. 16 indicates with a line 102 that the trim etch process removes a part of the outer region of the mesa 56 leading to a small mesa-structure, as shown in FIG. 17. The trim edge process may also remove the filled gaps 80 as shown in FIG. 17.

FIG. 18 shows a VCSEL 120 fabricated in accordance with the method of forming the optical aperture 24 in the intermediate layer 50, according to the present invention. The outer region of the intermediate layer 50 comprises a combination of a deposited layer of electrically non-conducting material 90 and a high-refractive index material 106. In comparison with an optical aperture conventionally formed by oxidizing the intermediate layer without subsequently replacing the oxidized layer at least in part with a high-quality non-conductive layer, the transition of the crystallographic structure from the high-quality layer forming the optical aperture to the adjacent layers above and below the high-quality layer will rather be sharp than smeared, while in case of the conventional method the transition of the crystallographic structure from the oxide layer to the adjacent layers rather is smeared than sharp.

Figure 19:
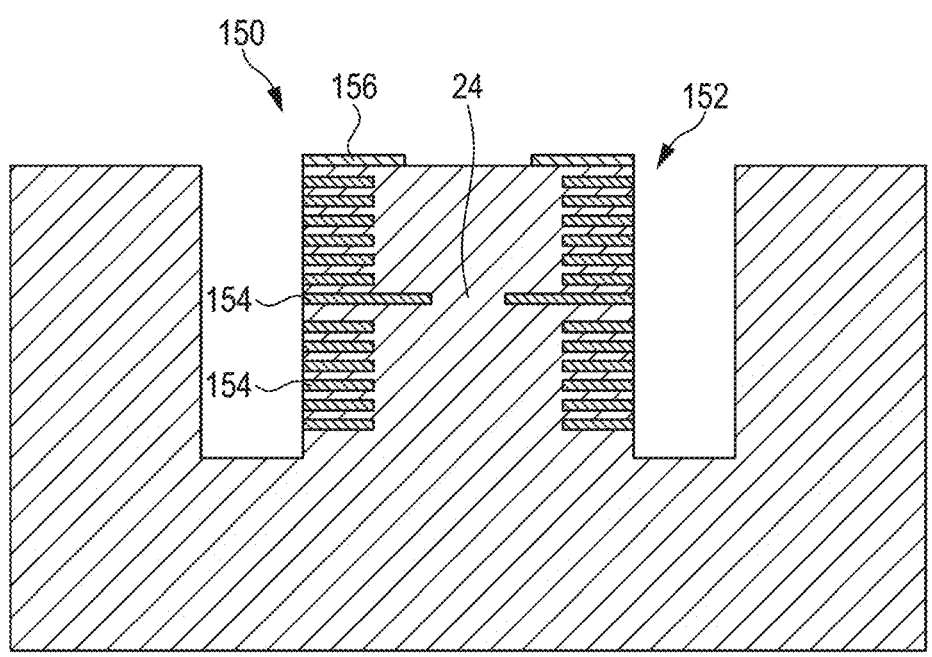
FIG. 19 shows a sketch of a comparative example of a VCSEL with optical aperture.

FIG. 19 shows a comparative example of a conventional VCSEL 150 with optical aperture 24. In comparison with the VCSEL 120 in FIG. 18, the VCSEL 150 fabricated according to conventional techniques has a mesa 152 which is wider than the mesa 56 of the VCSEL 120. Further, the mesa 152 of the VCSEL 150 comprises low quality oxidized material 154 in the layer comprising the optical aperture 24 which has been obtained by oxidizing the semiconductor material of this layer, and in further layers surrounding the optical aperture 24.

FIG. 18 and FIG. 19 also show an electric contact 124 and an electrical contact 156, respectively on top of the mesa 56 and 152, respectively.

It is to be understood that more than one optical aperture may be formed with the method according to the present disclosure in a single mesa.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method of forming an optical aperture of a vertical cavity surface emitting laser, comprising:
providing a layer stack of semiconductor layers, the semiconductor layers including an intermediate layer comprising a semiconductor material suitable to be oxidized,
oxidizing the intermediate layer to an oxidation width so as to form an oxidized outer region and a non-oxidized central region in the intermediate layer,
removing at least a part of the oxidized outer region so as to form a gap where the oxidized outer region or the part of the oxidized outer region has been removed,
depositing an electrically non-conducting material on walls of the gap with a thickness smaller than a thickness of the gap, and
filling, after the depositing of the electrically non-conducting material, a remaining void of the gap with a further material.

2. The method of claim 1, wherein the providing of the layer stack includes:
epitaxially growing the layer stack,
etching the layer stack to form a pre-form of a mesa and a support structure at least partially surrounding the pre-form of the mesa, the support structure comprising an outer supporting region and at least one supporting web connecting the outer support region with the pre-form of the mesa, wherein the pre-form of the mesa includes the intermediate layer.

3. The method of claim 2, wherein etching the layer stack is performed such that the pre-form of the mesa has a tapering outer wall.

4. The method of claim 3, further comprising, after depositing the electrically non-conducting material in the gap, trim etching the pre-form of the mesa to obtain a final mesa having a straight outer wall.

5. The method of claim 1, wherein the intermediate layer has a thickness larger than thicknesses of semiconductor layers adjacent to the intermediate layer.

6. The method of claim 5, wherein the intermediate layer has a thickness in a range from about 80 nm to about 100 nm.

7. The method of claim 1, wherein the semiconductor material of the intermediate layer is an Al-based semiconductor material.

8. The method of claim 1, wherein removing at least part of the oxidized outer region of the intermediate layer is performed by etching using a hydrofluoric acid dip or a fluorine gas phase based etching process.

9. The method of claim 1, wherein depositing the electrically non-conducting material is performed using atomic layer deposition.

10. The method of claim 1, wherein the electrically non-conducting material is deposited on the walls of the gap with a thickness in a range from about 2 nm to about 5 nm.

11. The method of claim 1, wherein the electrically non-conducting material is $Al_2O_3$ or oxidized TiN or $TiO_2$.

12. The method of claim 1, wherein the further material is AlN or SiN.

13. The method of claim 1, wherein the filling of the remaining void with a further material is performed using fluid chemical vapor deposition.

14. The method of claim 1, wherein oxidizing the intermediate layer comprises wet-oxidation at a temperature in a range from about 320° C. to 350° C. and at a pressure of higher than 500 mbar.

15. A vertical cavity surface emitting laser, comprising:
a layer stack of semiconductor layers, the semiconductor layers including at least one intermediate layer comprising a semiconductor material and forming an optical aperture of the vertical cavity surface emitting laser,
wherein the at least one intermediate layer has a central region comprising the semiconductor material, and an outer region comprising a deposited layer of electrically non-conducting material deposited on walls of a gap formed by removal of oxidized material from at least a part of the outer region, wherein the deposited layer has a thickness which is smaller than a thickness of the intermediate layer, and the outer region additionally comprises a further material filling a remaining void of the gap not filled by the layer of electrically non-conductive material.

* * * * *